(12) United States Patent
Peng (10) Patent No.: US 7,053,657 B1
(45) Date of Patent: May 30, 2006

(54) DYNAMICALLY BIASED WIDE SWING LEVEL SHIFTING CIRCUIT FOR HIGH SPEED VOLTAGE PROTECTION INPUT/OUTPUTS

(75) Inventor: Tao Peng, Nashua, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/871,586

(22) Filed: Jun. 17, 2004

Related U.S. Application Data (60) Provisional application No. 60/482,972, filed on Jun. 26, 2003.

(51) Int. Cl.
H03K 19/094 (2006.01)

(52) U.S. Cl. .......................... 326/68; 326/80

(58) Field of Classification Search ............ 326/63–74, 326/80, 81, 83, 86; 327/112, 333, 52, 65
See application file for complete search history.

(56) References Cited

U.S. PATENT DOCUMENTS

| | | | |
|---|---|---|---|
| 4,253,161 A | 2/1981 | Paul et al. | 365/87 |
| 4,263,564 A | 4/1981 | Lafon | 330/293 |
| 4,446,567 A | 5/1984 | Iida et al. | 377/79 |
| 4,450,369 A | 5/1984 | Schuermeyer | 307/450 |
| 5,243,236 A * | 9/1993 | McDaniel | 326/68 |
| 5,256,983 A | 10/1993 | Nishiyama | 330/254 |
| 5,539,334 A * | 7/1996 | Clapp et al. | 326/68 |
| 5,631,940 A | 5/1997 | Fujikura | 377/64 |
| 5,781,026 A * | 7/1998 | Chow | 326/26 |
| 5,808,481 A * | 9/1998 | Thompson | 326/83 |
| 5,821,799 A * | 10/1998 | Saripella | 327/333 |
| 5,821,800 A * | 10/1998 | Le et al. | 327/333 |
| 5,834,962 A | 11/1998 | Okamoto | 327/333 |
| 5,861,775 A | 1/1999 | Chen et al. | 330/69 |
| 5,903,142 A | 5/1999 | Mann | 323/313 |
| 5,969,542 A * | 10/1999 | Maley et al. | 326/81 |
| 6,002,290 A * | 12/1999 | Avery et al. | 327/333 |
| 6,031,394 A * | 2/2000 | Cranford et al. | 326/81 |
| 6,049,608 A | 4/2000 | Ablowitz et al. | 380/28 |
| 6,137,360 A | 10/2000 | Memida | 333/253 |
| 6,191,636 B1 | 2/2001 | Cress et al. | 327/333 |
| 6,236,238 B1 * | 5/2001 | Tanji et al. | 326/83 |
| 6,501,306 B1 * | 12/2002 | Kim et al. | 327/112 |
| 6,590,420 B1 | 7/2003 | Mnich et al. | 326/68 |
| 6,768,352 B1 | 7/2004 | Maher et al. | 327/112 |
| 6,774,695 B1 | 8/2004 | Hayashi et al. | 327/333 |
| 6,784,719 B1 | 8/2004 | Okamoto et al. | 327/333 |
| 6,791,372 B1 * | 9/2004 | Jaussi | 327/65 |
| 6,806,757 B1 | 10/2004 | Mukai | 327/333 |
| 6,828,825 B1 * | 12/2004 | Johnson et al. | 326/68 |
| 6,853,234 B1 | 2/2005 | Bucossi | 327/333 |
| 6,856,204 B1 | 2/2005 | Kwon | 331/17 |
| 6,873,186 B1 | 3/2005 | Gion | 326/68 |
| 2003/0001628 A1 * | 1/2003 | Hsu et al. | 327/103 |

* cited by examiner

Primary Examiner—Linh Van Nguyen (57) ABSTRACT

Embodiments of the present invention recite a level shifting circuit for high voltage protection. In embodiments of the present invention, the level shifting circuit comprises a first transistor, a second transistor, a third transistor, and a fourth transistor coupled in a cascode configuration. The circuit further comprises a fifth transistor, a sixth transistor, a seventh transistor, and an eighth transistor coupled in a cascode configuration. The level shifting circuit further comprises an output coupled with the source of the first transistor, the gate of the seventh transistor, and with the drain of the second transistor. A first inverter is coupled with a second inverter in series and an input signal conveyed to the first inverter dynamically controls the bias level for said second and sixth transistors.

19 Claims, 6 Drawing Sheets

DYNAMICALLY BIASED WIDE SWING LEVEL SHIFTING CIRCUIT FOR HIGH SPEED VOLTAGE PROTECTION INPUT/OUTPUTS

RELATED APPLICATIONS

The present application claims priority to USPTO provisional application No. 60/482,972 filed Jun. 26, 2003, entitled "Dynamic Biased Wide Swing Level Shifting Circuit for High Speed High Voltage Protection Input/Outputs," by Tao Peng, assigned to the assignee of the present invention, and which is hereby incorporated by reference in its entirety herein.

FIELD OF THE INVENTION

The present invention relates generally to electronic circuits and in particular to output circuits.

BACKGROUND OF THE INVENTION

A integrated circuit (IC) process technology advances to higher densities, the feature size of a transistor is reduced enabling low-voltage high speed operation and high density layout. Another result of the reduced feature size is to also reduce the transistor's gate oxide voltage tolerance. Some conventional input/output (I/O) standards require an IC to interface with external voltages that are higher than the internal voltages used within the IC. Thus, it is necessary to interface low-voltage transistors to high voltage systems. This is an important challenge in input/output (I/O) design.

Figure 1:
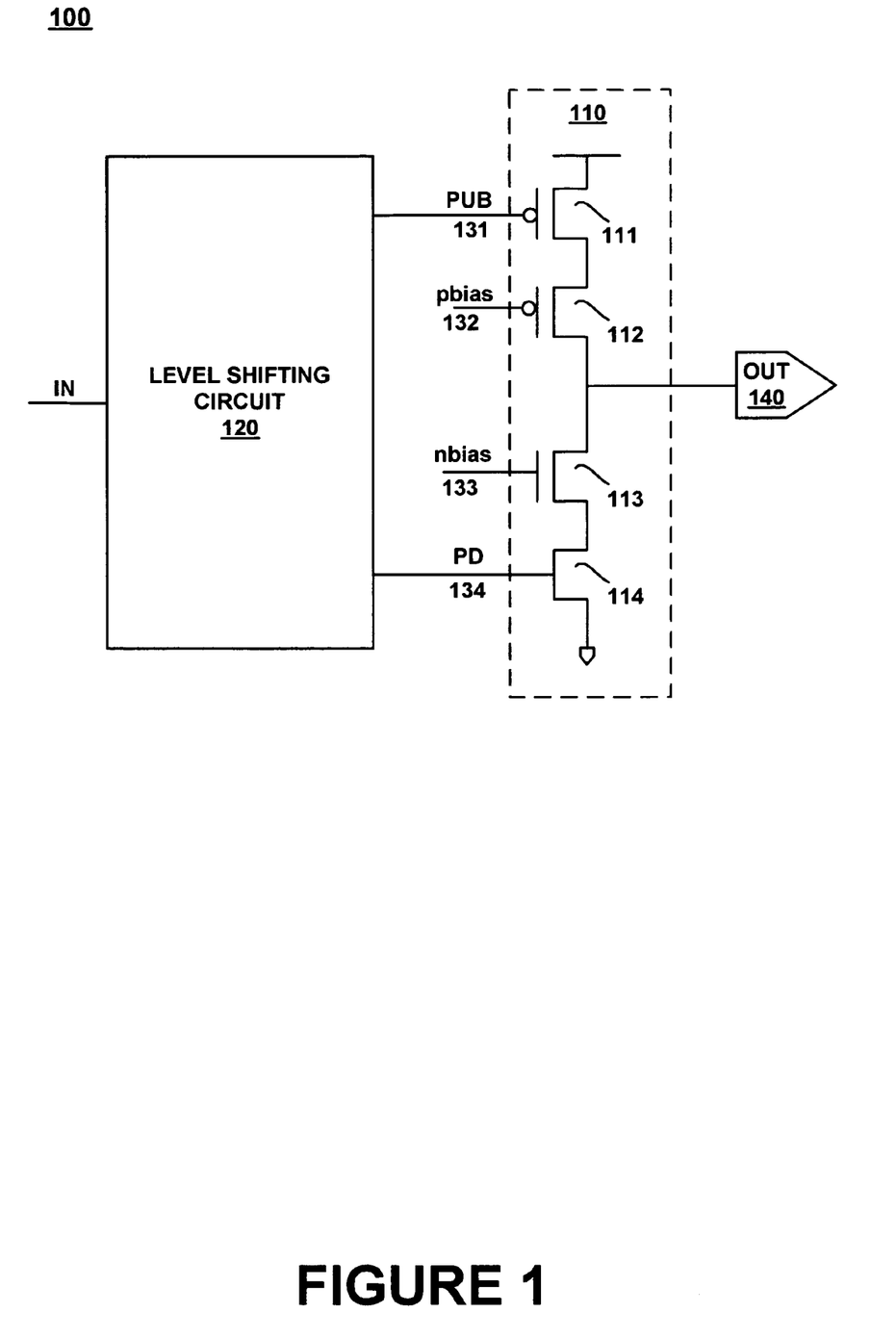
FIG. 1 shows a conventional high voltage protection architecture for an I/O circuit.

An exemplary conventional output buffer architecture with high voltage protection is shown in FIG. 1. In FIG. 1, an output stage 110 comprising a first transistor 111, a second transistor 112, a third transistor 113, and a fourth transistor 114 coupled in a cascode configuration is coupled with a level shifting circuit 120 and an output 140. Level shifting circuit 120 translates the internal CMOS voltage level to a voltage level which is conveyed to pullup bar output (PUB) 131 and pulldown output (PD) 134. Since the level shifting circuit 120 is operating under external voltage levels, high voltage protection is necessary for transistors inside this level shifting circuit 120 as well.

Transistors 111 and 114 are coupled with a pullup bar (PUB) output 131 and a pulldown (PD) output 134 respectively which convey signals from level shifting circuit 120. Transistors 112 and 113 are coupled with a pbias output 132 and an nbias output 133 respectively and provide protection from high voltage inputs and prevent the pullup bar (PUB) 131 and pulldown (PD) 134 signals from going above 2.5 volts (2.5V).

Figure 2:
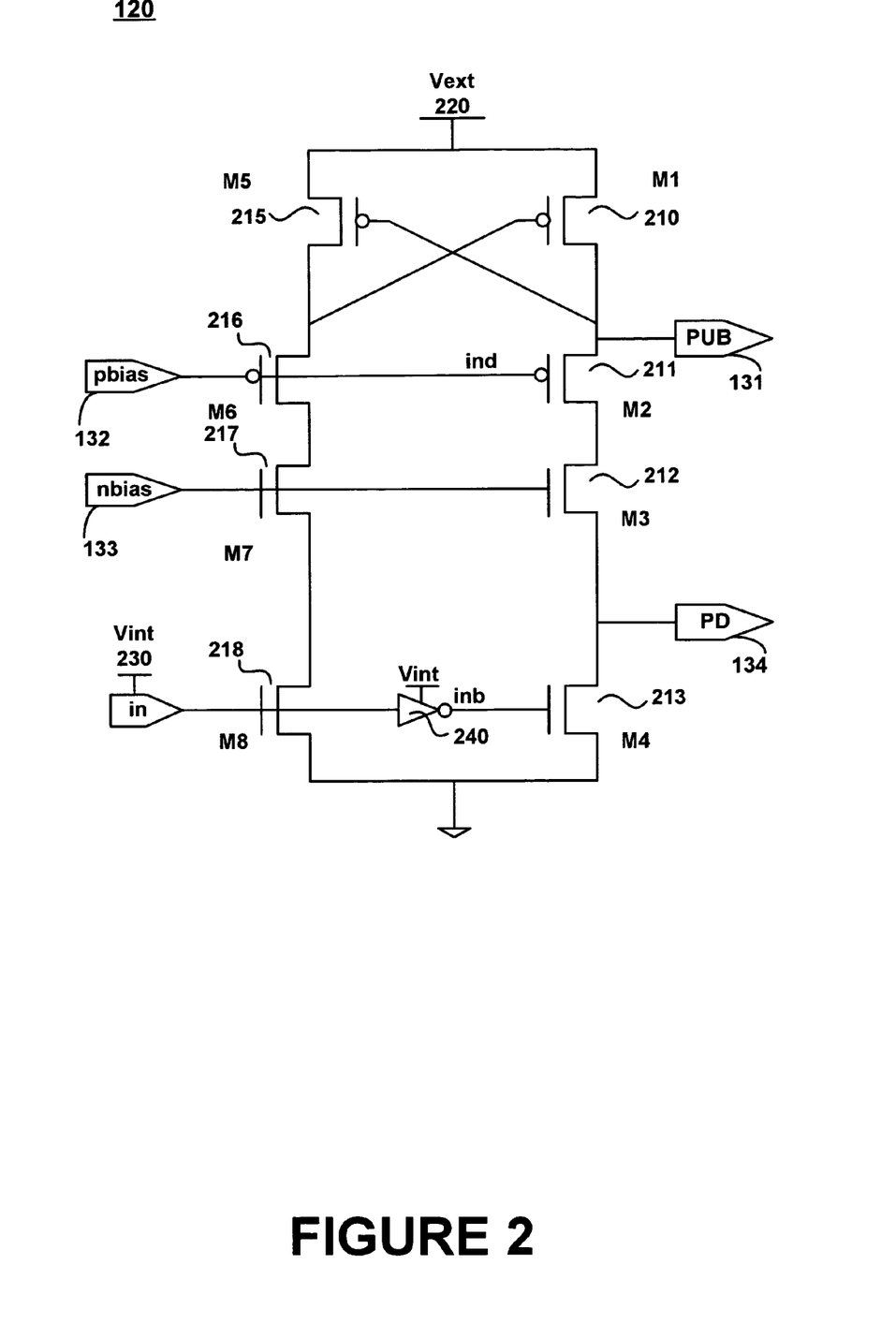
FIG. 2 shows a conventional implementation of an exemplary cascode level-shifting circuit.

A conventional implementation of a cascode level-shifting circuit (e.g., level shifting circuit 120) is shown in FIG. 2. In FIG. 2, level shifting circuit 120 comprises transistors 210, 211, 212, and 213 coupled in a cascode configuration. Transistors 215, 216, 217, and 218 are also configured in a cascode configuration. Transistors 210 and 215 are coupled as a cross coupled latch and an external voltage (e.g., Vext 220) is coupled with the drain of transistor 210 and the drain of transistor 215. A pbias input (e.g., pbias 132 of FIG. 1) is coupled with the gate of transistor 211 and the gate of transistor 216. An nbias input (e.g., nbias signal 133 of FIG. 1) is coupled with the gate of transistor 212 and with the gate of transistor 217. An input voltage 230 is coupled with the gate of transistor 218 and with the input of inverter 240. The output of inverter 240 is coupled with the gate of transistor 213. The sources of transistors 213 and 218 are coupled with a ground.

To protect the internal circuitry of level shifting circuit 120, the voltage level of PUB 110 must meet certain conditions. One condition is that the voltage conveyed via PUB 131 must be greater than the sum of pbias 132 and the absolute value of Vtp where Vtp is the threshold value of a pmos transistor (e.g., transistor 211 of FIG. 2). A second condition is that pbias 132 must be greater than the difference between the external voltage (e.g., Vext 220) and the stress voltage (Vstress) of the transistors to avoid overstress. Equations of the above conditions are shown below:

$$PUB > pbias + (Vtp) \quad (1)$$

$$pbias > Vext - Vstress \quad (2)$$

Combining the two above conditions yields a third equation shown below:

$$PUB > Vext - Vstress + (Vtp) \quad (3).$$

Applying equation 3 to a 2.5V field effect transistor (FET) operating with a 3.3V supply voltage, the lowest output voltage level, also referred to as "voltage output low" (VOL) conveyed by PUB 131 is $>3.3V-2.5V+0.6V$. Thus the lowest output voltage level conveyed via PUB 131 $>1.4V$. This voltage level is limited because pbias 132 and nbias 113 are maintained at a static voltage level of 0.8V. However, this voltage level is not low enough to fully turn on transistor 111 which is controlled by PUB 131. As a result, the pullup current output by output stage 110 via output 140 can be too low, thus restricting the speed of input/output (I/O) operations of the output buffer.

SUMMARY OF THE INVENTION

Accordingly, it would be desirable to have a high voltage protection circuit where the voltage conveyed by the PUB ouput is allowed to go lower than in conventional solutions, thus facilitating switching the output stage more quickly while maintaining robust high voltage protection.

Embodiments of the present invention comprise a high voltage protection circuit which allows the voltage conveyed by the PUB output to go lower than in conventional solutions. As a result, faster switching of the output stage coupled with the present invention is realized while still maintaining robust high voltage protection. In general, embodiments of the present invention utilize a dynamic biasing of pmos cascode transistors of the level shifting circuit.

Embodiments of the present invention recite a level shifting circuit for high voltage protection. In embodiments of the present invention, the level shifting circuit comprises a first transistor, a second transistor, a third transistor, and a fourth transistor coupled in a cascode configuration. The circuit further comprises a fifth transistor, a sixth transistor, a seventh transistor, and an eighth transistor coupled in a cascode configuration. The level shifting circuit further comprises an output (e.g., PUB output) coupled with the source of the first transistor, the gate of the fifth transistor, and with the drain of the second transistor. A first inverter is coupled with a second inverter in series and an input signal conveyed to the first inverter dynamically provides a dynamic pmos bias to the sixth transistor. An output of the second inverter provides a dynamic pmos bias to the second transistor thereby controlling the voltage level of the output. The dynamic pmos bias signals are also dependent on the input signal.

Because of the delay introduced by the two inverters in series, the voltage conveyed by the PUB output changes nearly simultaneously with a change in the voltage controlling the second transistor. In so doing, less dynamic stress is realized at the gate of the second transistor. Additionally, the voltage conveyed by the PUB output is significantly lower than in conventional level shifting circuits. As a result, more pullup current is allowed to pass from the output stage and the speed of I/O operations of the output buffer are achieved.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 3A:
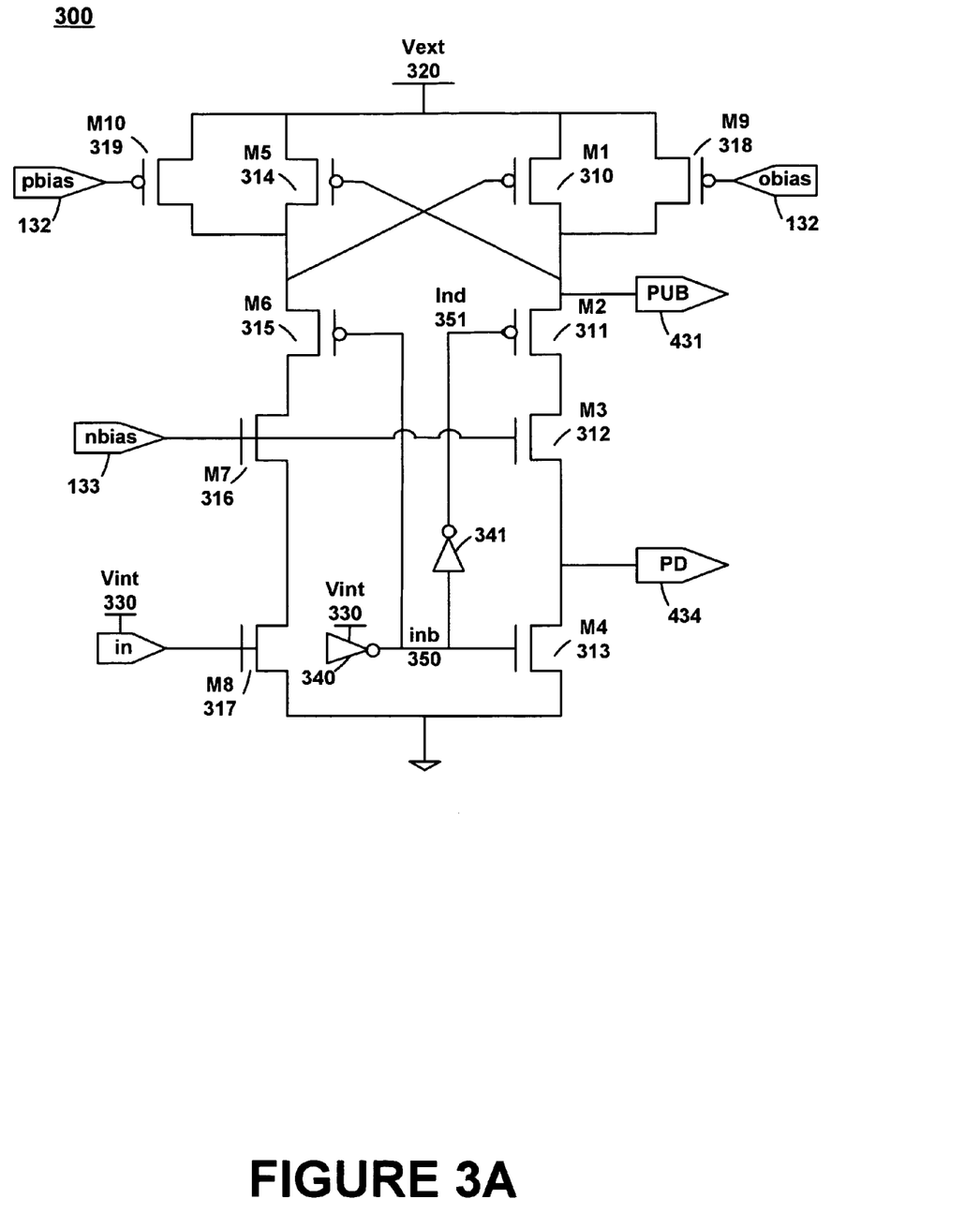
FIG. 3A shows a cascode level-shifting circuit in accordance with embodiments of the present invention.

A cascode level-shifting circuit 300 in accordance with embodiments of the present invention is shown in FIG. 3A. In one embodiment, level shifting circuit 300 comprises transistors 310, 311, 312, and 313 coupled in a cascode configuration. Transistors 314, 315, 316, and 317 are also configured in a cascode configuration. In the embodiment of FIG. 3A, transistors 310, 311, 314, and 315 are positive-channel metal oxide semiconductor field effect transistors (FETs) and transistors 312, 313, 316, and 317 are negative-channel metal oxide semiconductor field effect transistors. Transistors 310 and 314 are configured as a cross coupled latch and an external voltage (e.g., Vext 320) is coupled with the drain of transistor 310 and the drain of transistor 315 and the sources of transistors 313 and 317 are coupled with a ground.

Circuit 300 further comprises a current source comprising transistors 318 and 319 coupled with transistors 310 and 314 respectively. More specifically, the source and drain of transistor 318 are coupled with the source and drain of transistor 310 respectively. Additionally, the source and drain of transistor 319 are coupled with the source and drain of transistor 314 respectively. A pbias input (e.g., pbias 132) is coupled with the gate of transistor 318 and the gate of transistor 319. In embodiments of the present invention, pbias 132 is a static voltage signal generated by a circuit (not shown) which may be separate from circuit 300.

An nbias input (e.g., nbias 133) is coupled with the gate of transistor 312 and with the gate of transistor 316. In embodiments of the present invention, nbias 133 is a static voltage signal generated by a circuit (not shown) which is separate from circuit 300. An input (e.g., Vint 330) is coupled with the gate of transistor 317 and is also coupled with the input of inverter 340. In embodiments of the present invention, Vint 330 is a dynamic signal generated by a circuit (not shown) which is separate from circuit 300. Vint 330 may be a data signal, and is considered the input to be level shifted. Inverter 340 outputs a signal over line inb 350 which is coupled with the gate of transistor 315, the gate of transistor 313, and with the input of inverter 341. The output of inverter 340 provides a dynamic bias signal for pmos transistor 315. The dynamic bias signal varies with input Vint 330.

Inverter 341 outputs a signal via line ind 351 which is coupled with the gate of transistor 311. Line ind 351 provides a dynamic bias for pmos transistor 311 which varies with Vint 330. A first output (e.g., PUB 431) is coupled with the source of transistor 310, the gate of transistor 314, and the drain of transistor 311. A second output (e.g., PD 434) is coupled with the source of transistor 312 and the drain of transistor 313. In embodiments of the present invention, PUB 131 and PD 134 are coupled with an output stage (e.g., output stage 110) as described below with reference to FIG. 3B.

In circuit 300 of FIG. 3A, the voltage output by inverter 340 and inverter 341 varies as the voltage level of Vint 330 varies. Thus, the signals conveyed via line inb 350 and line ind 351 dynamically vary depending upon the input voltage of Vint 330. As a result, in embodiments of the present invention the voltages controlling the gates of pmos transistors 311 and 315, and transistor 317 are now dynamically biased as the voltage level of Vint 330 varies. Because transistor 311 is no longer controlled by a static voltage (e.g., pbias 132 of FIG. 2), the lowest voltage level conveyed by PUB 431 now equals the sum of Vtp (e.g., the threshold value of transistor 311) and the saturation voltage (e.g., Vdsat) of transistor 311. In equation form, this is expressed as:

$$PUB = Vtp + Vdsat = \sim 0.8V$$

In embodiments of the present invention, pmos transistors 315 and 311 are now biased dynamically by signals inb 350 and ind 351 respectively as a function of changes in the voltage level of Vint 330. In so doing, the PUB 431 can now swing much lower without causing high voltage stress on transistors 311 and 315. Additionally, because ind 351 and PUB 431 always move together, static stress on the gate oxide of transistor 311 is reduced.

According to an embodiment of the present invention, dynamic stress on transistor 311 is reduced by the delay introduced by inverters 340 and 341. Thus, if Vint 330 swings from high to low, transistor 313 is turned on first to pull PUB 431 from Vddio to Vstress before ind 351 goes low. In conventional implementations of a level shifting circuit, a change in the input signal (e.g., Vint 230 of FIG. 2) caused a change in the voltage at transistor 211 before the voltage level of PUB 431 began to change. The difference between the voltage at the source of transistor 211 and the voltage level of PUB 431 caused a transient spike in the voltage at the gate of transistor 211 which could damage the gate oxide of transistor 211. However, in embodiments of the present invention, the voltage levels of ind 351 and PUB 431 change nearly simultaneously, thereby reducing the transient stress on transistor 311.

Thus, in embodiments of the present invention, PUB 431 can now drop to approximately 0.8V which is significantly lower than the 1.4V of the conventional implementation. As a result, embodiments of the present invention facilitate faster transistor turn-on (e.g., transistor 411 of FIG. 3B) thus allowing greater pullup current to pass via output 440 which results in faster I/O operations of the output buffer 410.

In circuit 300, the cross-coupled transistors M5 and M1 comprise a latch. The pbias input to transistors 318 and 319 (e.g., pbias 132) is used to reduce the crowbar effect in the latch and generate Vdsat of transistor 311 to compensate for the offset between the (Vtp) and the minimum biasing voltage to reduce the likelihood of high voltage stress.

Figure 3B:
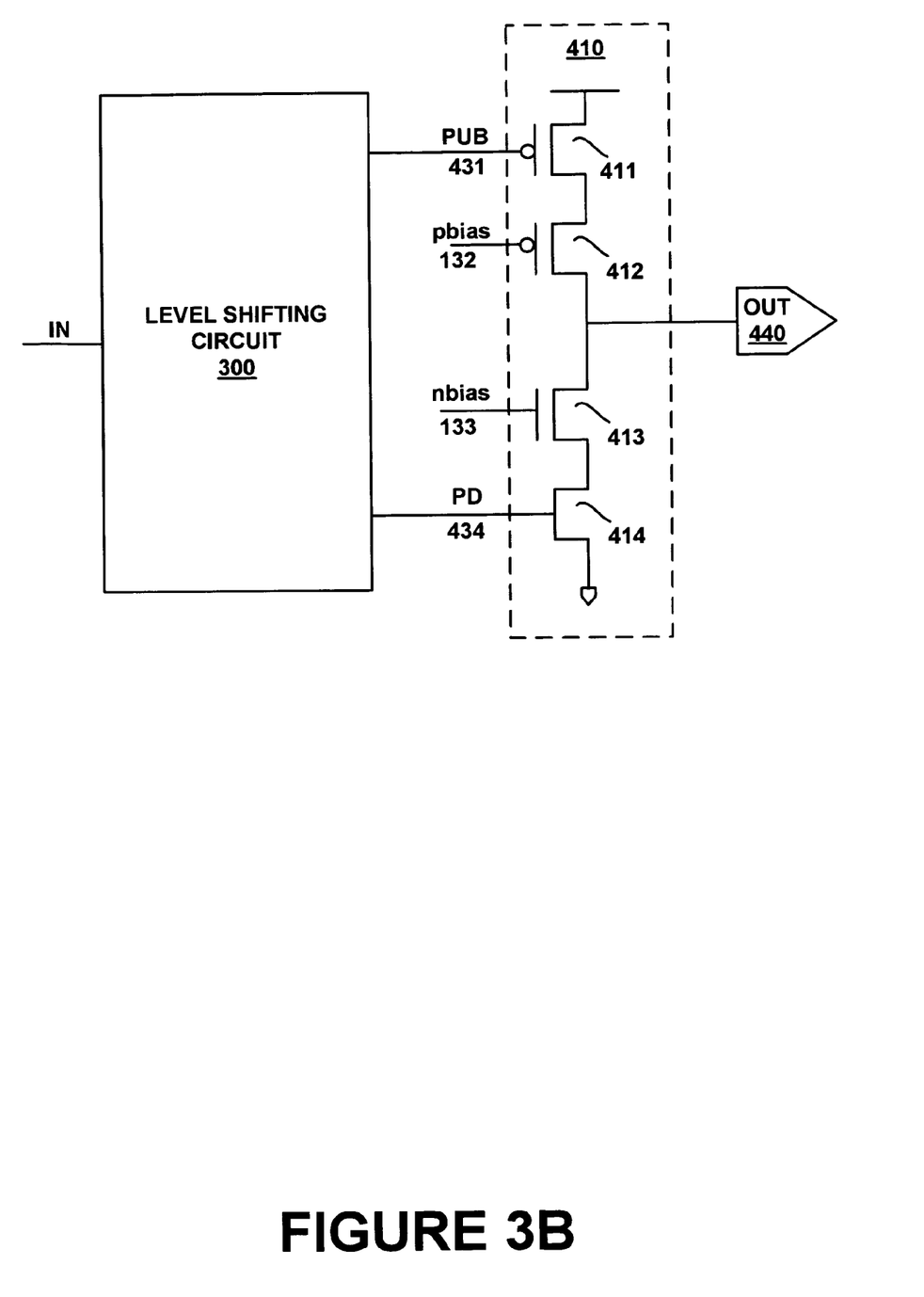
FIG. 3B shows a cascode level-shifting circuit coupled with an output stage in accordance with embodiments of the present invention.

An exemplary conventional output buffer architecture with high voltage protection in accordance with embodiments of the present invention is shown in FIG. 3B. In FIG. 3B, an output stage 410 comprising a first transistor 411, a second transistor 412, a third transistor 413, and a fourth transistor 414 coupled in a cascode configuration is coupled with level shifting circuit 300 of FIG. 3A and an output 440.

Transistors 411 and 414 are coupled with PUB 431 and PD 434 respectively which convey signals from level shifting circuit 300. Transistors 412 and 413 are coupled with a pbias input 432 and an nbias input 433 respectively. In embodiments of the present invention, pbias input 432 and nbias input 433 are similar to the pbias input 132 and the nbias input 133 of FIG. 3A.

Figure 4:
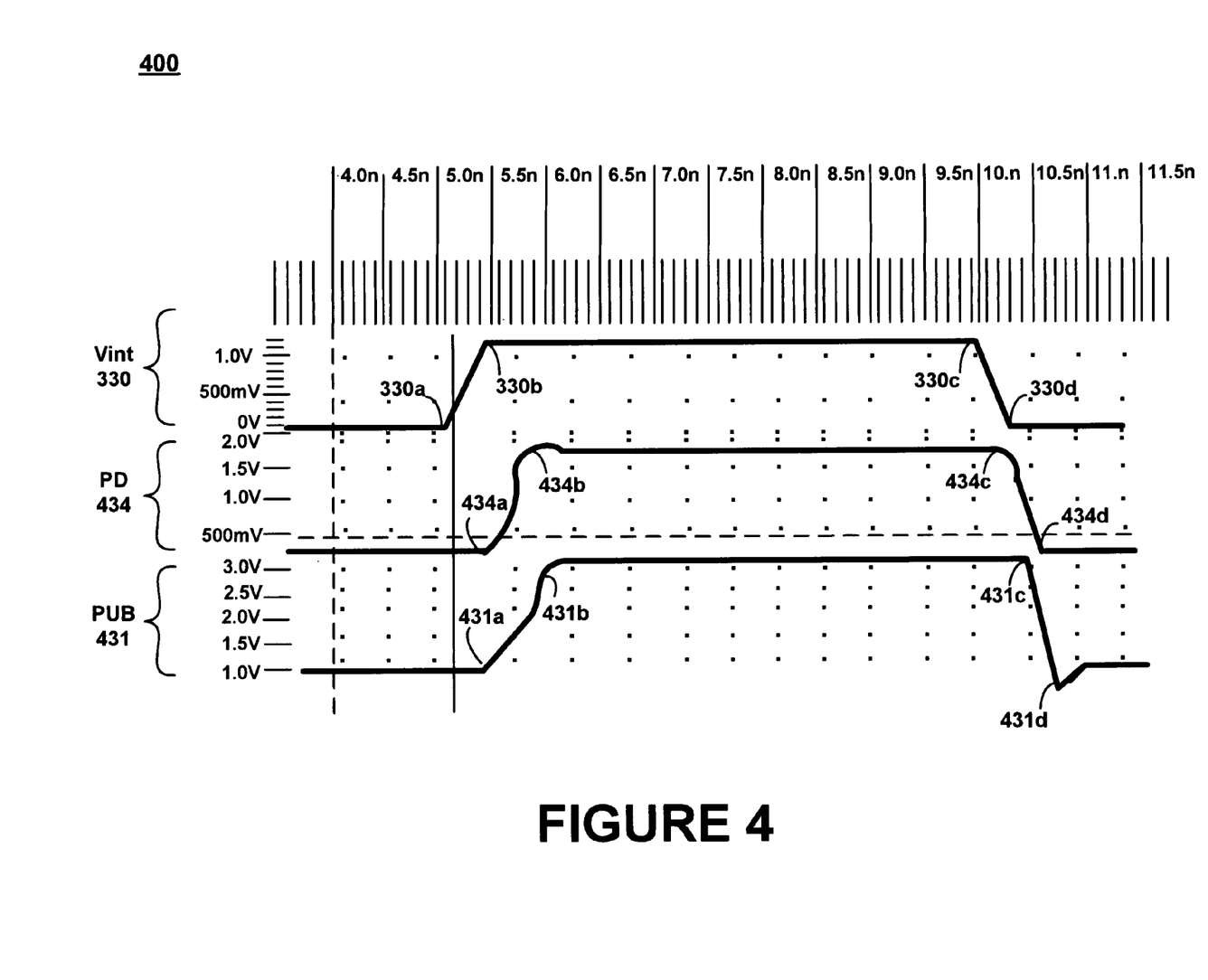
FIG. 4 shows a timing diagram a cascode level-shifting circuit in accordance with embodiments of the present invention.

FIG. 4 shows timing diagrams of circuit 300 in accordance with embodiments of the present invention. Specifically, it shows how changes in the voltage level of Vint 330 affect the voltage levels of signals conveyed via PD 434, PUB 431, inb 350, and ind 351.

The following discussion will also refer to FIG. 3A and FIG. 3B, to explain the operation of embodiments of the present invention. As shown in FIG. 4, when the voltage level of Vint 330 changes from a low level (e.g., 330a) to a high level (e.g., 330b), transistor 316 is turned on. At the same time Vint is input into inverter 340. As a result, when the voltage level of Vint 330 changes from a low level to a high level, the voltage level conveyed by inb 350 changes from a high level (e.g., 350a) to a low level (e.g., 350b). Because inb 350 is input into inverter 341, when inb 350 changes from a high level to a low level, the voltage conveyed by ind 351 changes from a low level (e.g., 351a) to a high level (e.g., 351b). When the voltage conveyed by ind 351 changes to a high level, it shuts off transistor 311, which then causes the voltage level of the signal conveyed by PUB 431 to be pulled up by transistor 310 (e.g., from 431a to 431b) to approximately 3.3V (e.g., Vext 320).

At the same time, the drop in the voltage level conveyed via inb 350 shuts off transistor 313, thus causing the signal conveyed via PD 434 to change from a low level (e.g., 434a) to a high level (e.g., 434b). However, because of the voltage drop across transistors 310, 311, and 312, the voltage level conveyed via PD 434 only rises to approximately 2.0V.

When the voltage level conveyed by PUB goes up, it shuts off the PMOS device in the output stage 410 (e.g., transistor 411 of FIG. 3B). Additionally, the signal conveyed via PD 434 rises and turns on the NMOS device in output stage 410 (e.g., transistor 414 of FIG. 3B). This in turn causes the signal conveyed via output 440 to drop.

Alternatively, when the voltage level of Vint 330 changes from a high level (e.g., 330c) to a low level (e.g., 330d), transistor 316 is turned off. At the same time Vint is input into inverter 340. As a result, when the voltage level of Vint 330 changes from a high level (e.g., 330c) to a low level (e.g., 330d), the voltage level conveyed via inb 350 changes from a low level (e.g., 350c) to a high level (e.g., 350d). Because inb 350 is input into inverter 341, when the signal conveyed by inb 350 changes from a low level to a high level, the signal conveyed via ind 351 changes from a high level (e.g., 351c) to a low level (e.g., 351d). When the signal conveyed via ind 351 changes to a low level, it turns on transistor 311, which then causes the voltage level conveyed via PUB 431 to drop (e.g., from 431c to 431d) to approximately 0.8V following a falling edge of the input (e.g., Vint 330).

At the same time, the rise in the voltage level of inb 350 turns on transistor 313, thus causing the signal conveyed via PD 434 to change from a high level (e.g., 434c) to a low level (e.g., 434d).

When the voltage level conveyed via PUB drops, it turns on the PMOS device in the output stage 410 (e.g., transistor 411 of FIG. 3B). Additionally, the voltage level conveyed via PD 434 drops and turns off the NMOS device in output stage 410 (e.g., transistor 414 of FIG. 3B). This in turn causes the signal conveyed via output 440 to rise.

The preferred embodiment of the present invention, a dynamically biased wide swing level shifting circuit for high speed voltage protection input/outputs, is thus described. While the present invention has been described in particular embodiments, it should be appreciated that the present invention should not be construed as limited by such embodiments, but rather construed according to the following claims.

What is claimed is:

1. A level shifting circuit comprising:
   a shifter circuit for receiving an input signal and comprising an nbias cascode portion and a pbias cascode portion, wherein said pbias cascode portion is biased with a dynamic signal that varies with said input signal, said shifter circuit for generating pull up and pull down signals;
   an inverter circuit comprising a first inverter coupled in series to said input signal and to a second inverter and wherein an output of said second inverter is coupled with said pbias cascode portion; and
   an output stage circuit coupled to receive said pull up and said pull down signals and for generating a level shifted output signal based on said input signal.

2. The level shifting circuit as described in claim 1 wherein said output stage comprises:
   a pair of series coupled pmos transistors comprising a first pmos transistor controlled by said pull up signal and a second pmos transistor coupled to a constant pbias signal; and
   a pair of series coupled nmos transistors coupled to said pair of series coupled pmos transistors, said pair of series coupled nmos transistors comprising a first nmos transistor controlled by said pull down signal and a second nmos transistor coupled to a constant nbias signal.

3. The level shifting circuit as described in claim 1 wherein said shifter circuit generates said dynamic signal that biases said pbias cascode portion.

4. A level shifting circuit as described in claim 1 wherein said pbias cascode portion further comprises a cross-coupled latch.

5. A level shifting circuit as described in claim 4 wherein a positive bias voltage is input to said cross-coupled latch.

6. The level shifting circuit as described in claim 5 wherein said positive voltage is a constant bias input.

7. A cascode level shifting circuit comprising:
   a first transistor, a second transistor, a third transistor, and a fourth transistor coupled in a cascode configuration;
   a fifth transistor, a sixth transistor, a seventh transistor, and an eighth transistor coupled in a cascode configuration;
   an output coupled with the source of said first transistor, the gate of said fifth transistor, and with the drain of said second transistor; and
   a first inverter coupled with a second inverter in series, and wherein an input signal conveyed to said first inverter dynamically controls the bias level for said second and sixth transistors.

8. The cascode level shifting circuit of claim 7 wherein an output of said second inverter is coupled with the gate of said second transistor.

9. The cascode level shifting circuit of claim 8 wherein said output of said cascode level shifting circuit conveys a pull up signal.

10. The cascode level shifting circuit of claim 7 wherein an output of said first inverter is coupled with the gate of said fourth transistor and with the gate of said sixth transistor.

11. The cascode level shifting circuit of claim 10 wherein said second transistor and said sixth transistor are positive-channel metal oxide semiconductor field effect transistor (PMOS).

12. The cascode level shifting circuit of claim 7 further comprising a ninth transistor and tenth transistor and wherein said ninth transistor conveys a positive bias to said first transistor and said tenth transistor conveys said positive bias to said fifth transistor.

13. The cascode level shifting circuit of claim 7 wherein a constant bias input is coupled with the gate of said seventh transistor and with the gate of said third transistor.

14. A level shifting circuit for high voltage protection comprising:
   a first transistor, a second transistor, a third transistor, and a fourth transistor coupled in a cascode configuration;
   a fifth transistor, a sixth transistor, a seventh transistor, and an eighth transistor coupled in a cascode configuration;
   a cross coupled latch comprising said first transistor and said fifth transistor; and
   an input signal coupled with said eighth transistor, wherein said input signal dynamically controls a positive bias voltage of said second transistor and said sixth transistor.

15. The level shifting circuit of claim 14 further comprising a ninth transistor and a tenth transistor which are coupled with said first transistor and said fifth transistor respectively, and wherein said positive bias input is coupled with the gate of said ninth transistor and with the gate of said tenth transistor.

16. The level shifting circuit of claim 14 wherein a constant bias input is coupled with the gate of said third transistor and with the gate of said seventh transistor.

17. The level shifting circuit of claim 14 further comprising a first inverter and a second inverter and wherein said input signal is further coupled with the input of said first inverter, and wherein the output of said first inverter is coupled with an input of said second inverter, the gate of said fourth transistor, and with the gate of said sixth transistor.

18. The level shifting circuit of claim 17 wherein the output of said second inverter is coupled with the gate of said second transistor.

19. The level shifting circuit of claim 14 further comprising an output and wherein said output is coupled with the source of said first transistor, the drain of said second transistor, and the gate of said fifth transistor.

* * * * *